United States Patent
Tobin et al.

(10) Patent No.: US 6,376,349 B1
(45) Date of Patent: Apr. 23, 2002

(54) PROCESS FOR FORMING A SEMICONDUCTOR DEVICE AND A CONDUCTIVE STRUCTURE

(75) Inventors: Philip J. Tobin; Olubunmi Adetutu; Bikas Maiti, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/487,472

(22) Filed: Jan. 19, 2000

(51) Int. Cl.[7] ................ H01L 21/3205; H01L 21/4763; H01L 21/144

(52) U.S. Cl. ................ 438/592; 438/682; 438/683

(58) Field of Search .................. 438/584, 682, 438/773, 592, 585, 683

(56) References Cited

U.S. PATENT DOCUMENTS

| | | | | |
|---|---|---|---|---|
| 6,060,361 A | * | 5/2000 | Lee | 438/283 |
| 6,103,609 A | * | 8/2000 | Lee et al. | 438/592 |
| 6,162,741 A | * | 12/2000 | Akasaka et al. | 438/773 |
| 6,187,656 B1 | * | 2/2001 | Lu et al. | 438/592 |

OTHER PUBLICATIONS

Lin et al, "Supression of Fluorine Penetration by Use of In Situ Stacked Chemical Vapor Deposited Tungsten Film", Nov. 17, 1998, Journal of The Electrochemical Society, 146 (8) pp. 3092–9096.*

Chang et al., "Suppression of Fluorine Penetration by Use of In Situ Stacked Chemical Vapor Deposited Tungsten Film," The Electrochemical Society, Inc., pp. 3092–3096 (1999).

Chatterjee et al., "Sub–100nm Gate Length Metal Gate NMOS Transistors Fabricated by a Replacement Gate Process," IEEE, pp. 33.1.1–33.1.4 (1997).

* cited by examiner

Primary Examiner—John F. Niebling
Assistant Examiner—Walter Z. Lindsay, Jr.
(74) Attorney, Agent, or Firm—Robert A. Rodriguez; George E. Meyer

(57) ABSTRACT

Semiconductor devices and conductive structures can be formed having a metallic layer. In one embodiment, a semiconductor device includes an amorphous metallic layer (22) and a crystalline metallic layer (42). The amorphous metallic layer (22) helps to reduce the likelihood of penetration of contaminants through the amorphous metallic layer (22). A more conductive crystalline metallic layer (42) can be formed on the amorphous metallic layer (22) to help keep resistivity relatively low. When forming a conductive structure, a metal-containing gas and a scavenger gas flow simultaneously during at least one point in time. The conductive structure may be part of a gate electrode.

15 Claims, 3 Drawing Sheets

PROCESS FOR FORMING A SEMICONDUCTOR DEVICE AND A CONDUCTIVE STRUCTURE

FIELD OF THE INVENTION

The present invention is generally related to semiconductor devices and more particularly to processes for forming semiconductor devices.

RELATED ART

Smaller semiconductor devices are requiring new materials to be used in order to make higher performance semiconductor transistors. Two areas of focus include the use of high-k gate dielectric materials and metal gates. Mid-band gap level materials are being investigated for use as metal electrodes. Materials being investigated for these metal gates include refractory metals such as titanium, tantalum, and tungsten compounds. Tungsten has a problem in that it is typically formed with a reaction of tungsten hexafluoride ($WF_6$) and molecular hydrogen ($H_2$) gas. During the reaction, a significant amount of fluorine is incorporated into the film as it is deposited. As the wafers are further processed, the fluorine leaves the tungsten and can diffuse into the gate dielectric. In the gate dielectric, the fluorine can degrade the quality of the gate dielectric and decreases its dielectric constant. In devices where a high-k gate dielectric is to be used, the fluorine counteracts the effects of the high-k gate dielectric. Further, even if a silicon dioxide gate is used, the effective dielectric constant of the film is reduced and decreases the amount of capacitive coupling between the gate electrode and the underlying semiconductor substrate. Other problems with the use of the $WF_6$ and $H_2$ reaction is that too much fluorine can cause adhesion problems between an oxide layer and a metal layer as well as higher leakage currents for the transistors formed.

The use of some refractory metal nitrides, by themselves, may be insufficient to block the fluorine penetration. For example, if a typical titanium nitride layer is covered by a conventionally formed tungsten layer, fluorine can still penetrate through the titanium nitride during subsequent anneal steps and cause similar problems.

Physical vapor deposition of the metal gate material may not be a good solution. During a physical vapor deposition, typically, a plasma is generated. During the sputtering process the gate dielectric may become damaged or actually remove some of the gate dielectric. Therefore, PVD for metal gates typically is not preferred. A chemical vapor deposition from a carbonyl source (e.g., $W(CO)_6$) may have problems with carbon contamination.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Semiconductor devices and conductive structures can be formed having a metallic layer. In one embodiment, a semiconductor device includes an amorphous metallic layer and a crystalline metallic layer. The amorphous metallic layer helps to reduce the likelihood of penetration of contaminants through the amorphous metallic layer. A more conductive crystalline metallic layer can be formed on the amorphous metallic layer to help keep resistivity relatively low. When forming a conductive structure, a metal-containing gas and a scavenger gas flow simultaneously during at least one point in time. The conductive structure may be part of a gate electrode. The present invention is defined by the claims and is better understood after reading the description of embodiments that follow.

Figure 1:
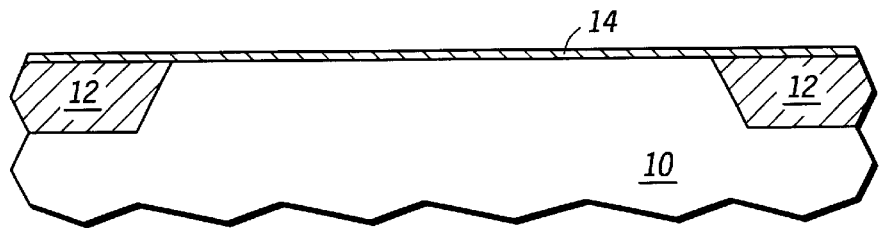
FIG. 1 includes an illustration of a cross-sectional view of a portion of a semiconductor device substrate after forming a gate dielectric layer.

FIG. 1 includes an illustration of a cross-sectional view of a portion of a semiconductor device substrate 10. As used in this specification, a semiconductor device substrate includes a monocrystalline semiconductor wafer, a semiconductor-on-insulator wafer, a compound semiconductor wafer (e.g., a silicon-germanium wafer, a silicon-germanium-carbon wafer, or any other substrate to be used for forming semiconductor devices. Field isolation regions 12 are formed within the substrate 10. A gate dielectric layer 14 is then formed over the substrate 10. In this particular embodiment, the gate dielectric layer 14 can include a traditional gate dielectric material including silicon dioxide, silicon nitride, silicon oxynitride or the like or may include a metallic oxide including titanium dioxide, tantalum pentoxide, strontium titanium oxide or other high-k gate dielectric materials. For the purposes of this specification, a high-k gate dielectric is a material that has a dielectric constant that is at least approximately 10.

Figure 2:
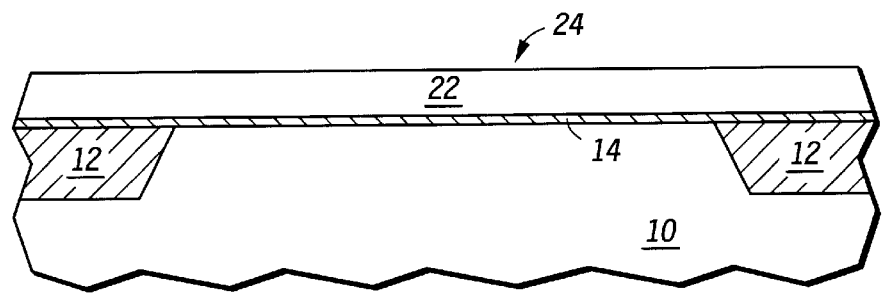
FIG. 2 includes an illustration of a cross-sectional view of the substrate of FIG. 1 after forming an amorphous metallic layer.

An amorphous metallic layer 22 is then formed over the gate dielectric layer 14 as shown in FIG. 2. During this deposition, at least two gases are used. One gas includes a metallic element and the other gas includes a semiconductive element. As used herein, a semiconductive element includes any of the Group IVA elements including silicon, germanium, etc. The first gas may include tungsten-containing, titanium-containing, or tantalum-containing compounds. Examples include metal halides (e.g., tungsten hexafluoride ($WF_6$), titanium tetrachloride ($TiCl_4$), or the like) tungsten carbonyl ($W(CO)_6$), tantalum-containing compounds and various metal organic compounds that typically contain tungsten, titanium, tantalum, hafnium, zirconium, aluminum, or the like. The metal gate is not limited to any of these particular metals. However, refractory metals typically are used since they can be subjected to relatively higher temperatures compared to other metals.

The second gas typically includes a "scavenging" gas. The scavenging gas helps to neutralize the groups that are attached to the metal atom(s). For example, if the groups attached to the metal atom are halides (F, Cl, Br, or I), the scavenging gas typically includes a semiconductive element or nitrogen. Examples include silane, dichlorosilane, various chlorosilanes, disilane, germane and various other germanium-containing or silicon-containing compounds. If the groups attached to the metal atom(s) are organic (e.g., carbonyl groups), the scavenging gas typically includes oxygen. The scavenging gas can include a semiconductive element or nitrogen when organic groups are attached to a metal atom. Therefore, nearly any combination of semiconductive elements, nitrogen, and oxygen can be used within the scavenging gas.

During the formation of the amorphous metallic layer 22, the metal precursor is to form the amorphous metallic layer without significant incorporation of the elements from the scavenging gas. If too much of the semiconductive element is incorporated into the film, it will form a silicide layer, which could have two potential detriments. One is that the silicon may be more likely to react with an oxide within a metal oxide gate dielectric to convert a portion of the metal oxide to silicon oxide. This is undesirable as it lowers the dielectric constant of the dielectric material. Obviously, if the gate dielectric layer includes only silicon containing compounds, this would not be an issue. However, regardless of the gate dielectric material, if too much silicon is present, a tungsten silicide layer results and has a resistivity approximately 10 times higher than tungsten. Therefore, enough of the semiconductor gas is added to allow the metal layer to be formed in an amorphous state without forming a corresponding silicide layer.

Similar reasoning follows when using an oxygen-containing gas. If $W(CO_6)$ is used for the amorphous metallic layer 22, enough oxygen is added to oxidize the carbonyl groups, but not so much that too much oxygen is incorporated into or oxidizes the tungsten. Regardless of the atoms within the scavenging gas, the amorphous metallic layer 22 should not have more than approximately ten weight percent of any element within the scavenging gas. Typically, it will have less than approximately one weight percent of any element within the scavenging gas In one specific example, the amorphous metallic layer 22 can be formed using $WF_6$ and silane ($SiH_4$). The ratio of semiconductive atoms to metal atoms within the gas should be no greater than approximately 3:1. That is, for example, one atom of tungsten for no more than three atoms of semiconductive element material. Typically, the ratio is at least 1.5 semiconductive atoms per one metallic atom. Note that the relative gas flow rates will be affected by how many semiconductive or metal atoms there are in the various gases. For example, if tungsten hexafluoride and silane are used, the silane may flow at approximately 2.5 times higher than the tungsten hexafluoride flow rate. However, if disilane is used, the disilane flow rate is approximately 1.25 times higher than the tungsten hexafluoride flow rate because disilane has two silicon atoms for every molecule of disilane.

The actual operating conditions used for forming the amorphous metal layer depend upon the reactor used. For example, if a Centura™ chamber on a tool from Applied Materials, Inc. of Santa Clara, Calif., the gas flow rate of the metal-containing species typically is no higher than approximately 100 standard cubic centimeters per minute (sccm). The pressure of the reactor typically is no higher than approximately 10 torr, and the deposition temperature is typically in a range of approximately 300 to 600 degrees Celsius. More typically, the temperature of the deposition is in the range of approximately 350 to 400 degrees Celsius. When forming the amorphous metal layer 22 directly over a gate dielectric layer 14, a plasma typically is not used because of the potential of removing a portion or damaging the underlying gate dielectric layer 14. However, if the amorphous metal layer 22 is formed over a thick insulating layer or over another metal-containing layer, a plasma may be used. If a plasma is used, the power may be in a range of approximately 200 to 500 watts for a 200-millimeter diameter substrate. The power may in part depend on the surface area of the substrate being processed. However, skilled artisans understand how to adjust the plasma power for the proper substrate size.

If the amorphous metallic layer is a refractory metal nitride such as tungsten nitride (WN), a nitrogen-containing gas is typically used. For example, molecular nitrogen ($N_2$) can be introduced with tungsten hexafluoride and silane to help form a tungsten nitride. Although not required, skilled artisans may want to avoid using ammonia gas ($NH_3$) as this may form ammonium salts during the reaction. Other nitrogen containing gases possibly could be used including nitrous oxide ($N_2O$) or nitric oxide (NO). In still another example, an amorphous TiN layer can be formed using $TiCl_4$, $N_2$, and $SiH_4$.

The amorphous metallic layer 22 can include a plurality of different films. For example, an amorphous TiN film can establish the work function of a transistor and be covered with an amorphous tungsten film. The total thickness of the amorphous metallic layer 22 is generally in a range of approximately 2 to 20 nanometers.

Figure 3:
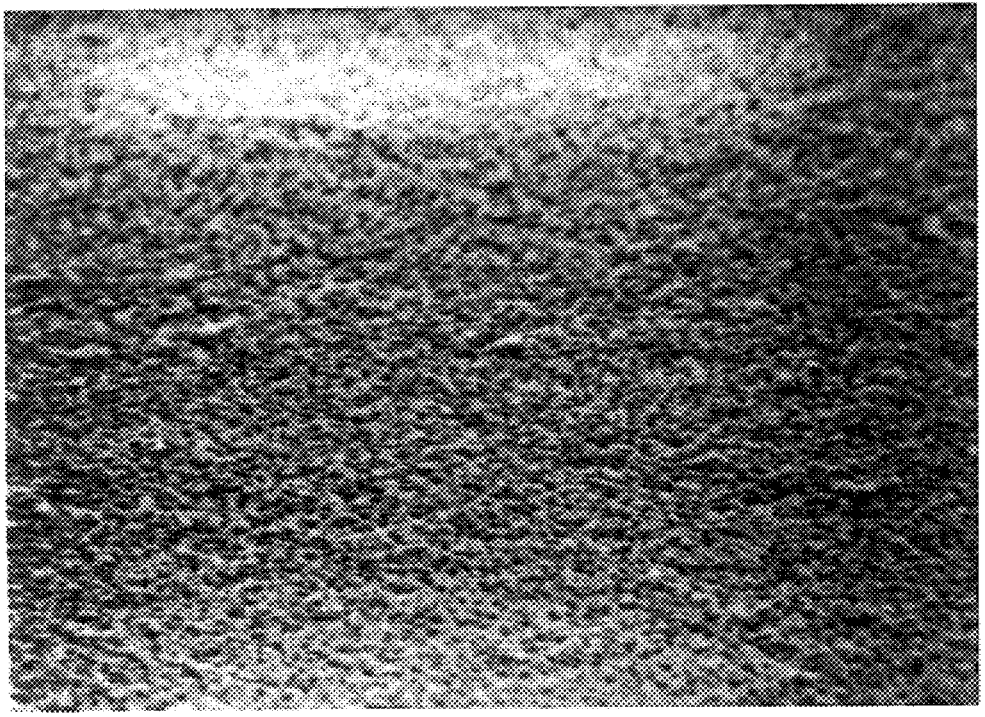
FIG. 3 includes an illustration of a top surface of the amorphous metal layer as formed in FIG. 2.

After forming the amorphous metallic layer 22, it has a surface 24 that is illustrated in FIG. 3. FIG. 3 is an illustration of a scanning electron microscopic analysis of the surface. Because the layer 22 is essentially amorphous, it can be seen that the layer has a relatively smooth surface. Although the layer 22 is called amorphous, it is possible that some nanocrystals could form but the predominant characteristic of the layer is still that it acts essentially as an amorphous layer.

Figure 4:
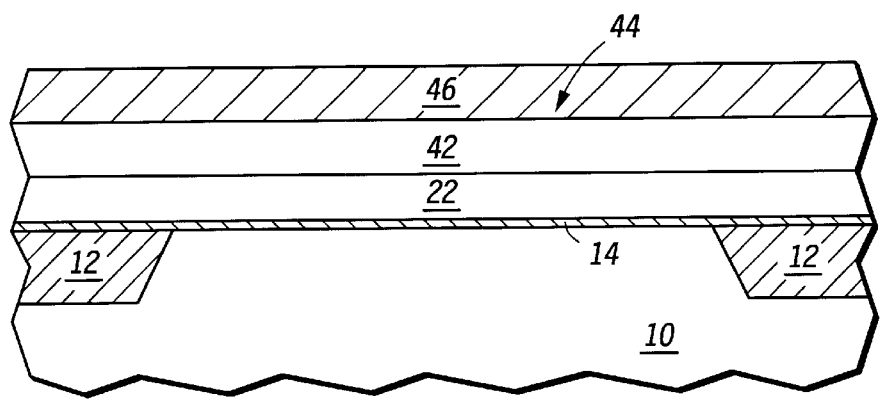
FIG. 4 includes an illustration of a cross-sectional view of the substrate of FIG. 2 after forming a crystalline metallic layer and a capping layer.
Figure 5:
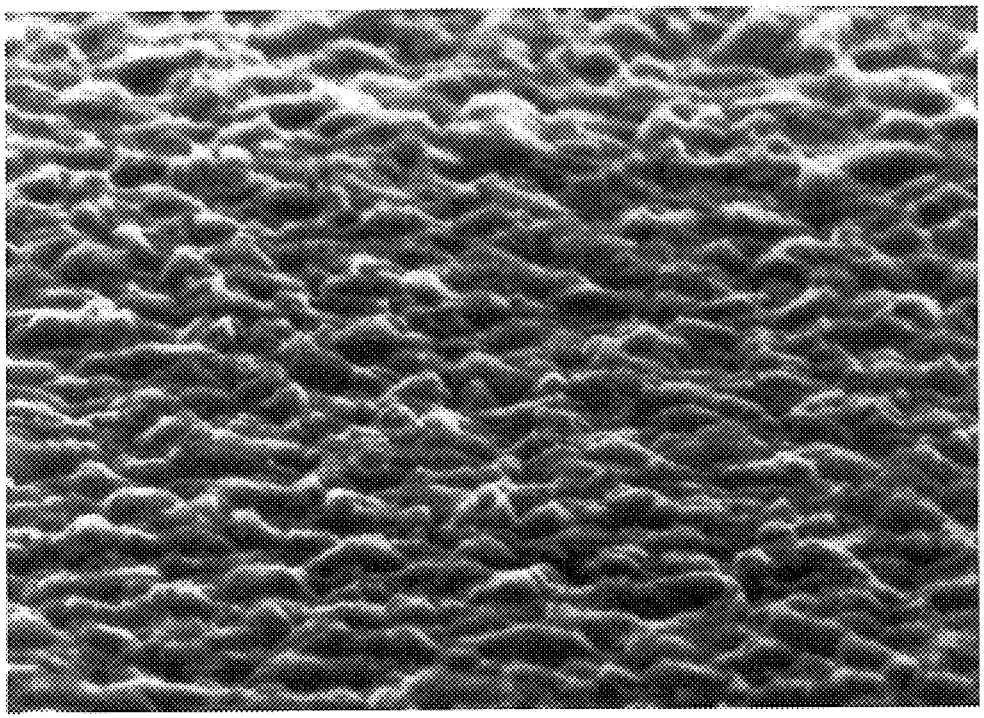
FIG. 5 includes an illustration of a top surface of the crystalline metal layer as formed in FIG. 4.

Processing is continued in depositing another layer that is part of the gate stack as illustrated in FIG. 4. A conventional polycrystalline metallic layer 42 is then formed over the amorphous metallic layer 22. In this particular embodiment, the crystalline metallic layer is tungsten that is formed with a reaction using tungsten hexafluoride and hydrogen. Unlike the formation of the underlying layer, no silicon-containing or other semiconductive element containing gases are used in its formation. The thickness of the layer as formed is determined by the electrical requirements for the device and other geometric requirements. Typically, the thickness of layer 42 is generally in a range of approximately 20–150 nanometers. The crystalline metallic layer 42 has a surface 44 that is generally represented by the illustration in FIG. 5. Because layer 42 is substantially crystalline in structure, its surface is rougher than that seen in FIG. 3.

After forming the layer 42, an anti-reflective layer 46 is then formed over the surface 44 as illustrated in FIG. 4. The anti-reflective layer 46 typically is an insulator and may include silicon nitride, silicon-rich silicon nitride, or if it is a conductor, it may include titanium nitride, titanium-rich titanium nitride, or the like. A characteristics between the two layers 22 and 42 is that the amorphous metallic layer may have a resistivity that is at least approximately 300 micro-ohm centimeters. The crystalline metallic layer 42 has a significantly lower resistivity to the amorphous metallic layer 22. For example, the crystalline metallic layer 42 may have a resistivity of approximately 10 micro-ohm centimeters. Although these are described specifically with respect to tungsten, similar resistivity ratios should be seen if other materials are used. Additionally, when forming the crystalline metallic layer 42, the amorphous metallic layer 22 will have a fluorine diffusivity that is at least approximately 10 times lower than the diffusivity of the metallic crystalline layer 42. Similar effects may be seen with other halogens, boron, carbon, or the like.

Figure 6:
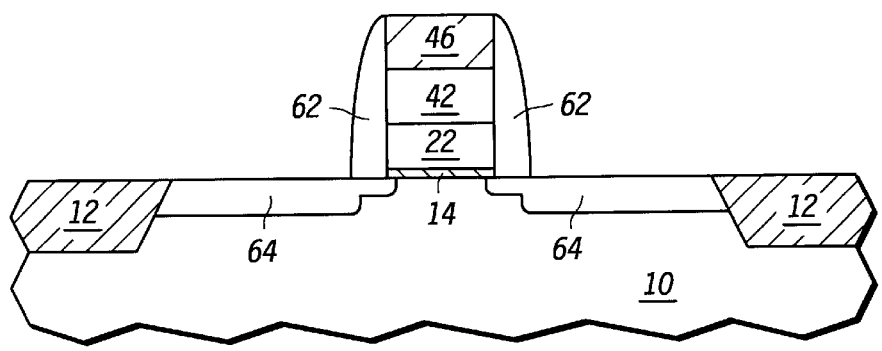
FIG. 6 includes an illustration of a cross-sectional view of the substrate of FIG. 4 after forming a field-effect transistor.

After forming the layers, the layers are then patterned to form the gate stack 60 as illustrated in FIG. 6. This etch extends through layers 22, 42 and 46. Sidewall spacers 62 are formed adjacent to the vertical edges of the gate stack 60. Doped regions 64 are formed within the semiconductor substrate and typically are formed before, after or both before and after the formation of the spacers 62. The doped region 64 typically has a doping concentration of at least 1E19 atoms per cubic centimeter to allow ohmic contacts to be formed to the doped regions which are source and drain regions for the transistor as illustrated in FIG. 6.

Figure 7:
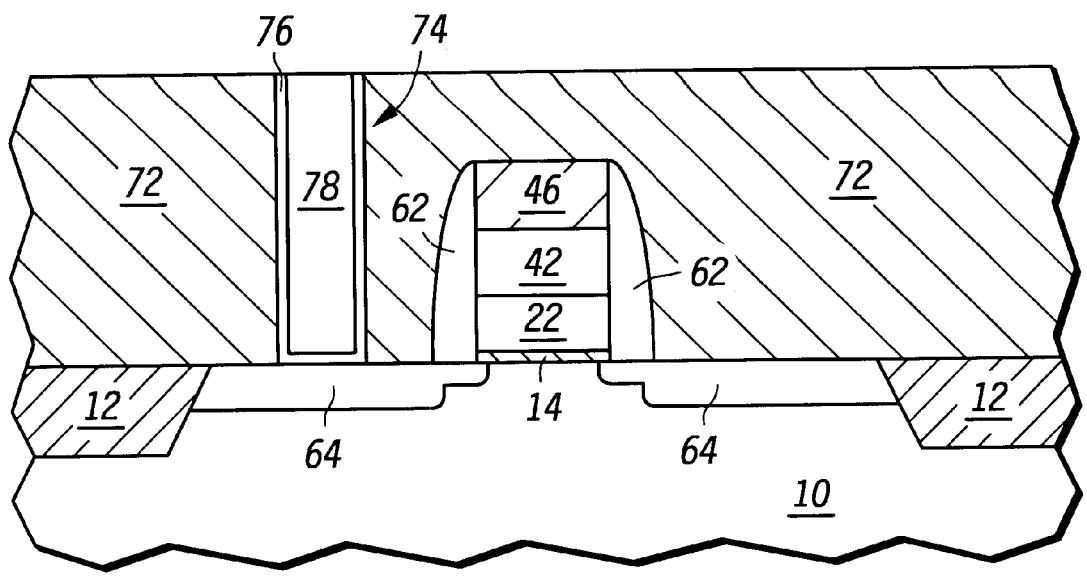
FIG. 7 includes an illustration of a cross-sectional view of the substrate of FIG. 6 after forming an interlevel dielectric layer and a contact structure.

Processing continued as illustrated in FIG. 7. A first interlevel dielectric (ILD) layer 72 is formed over the gate structure and gate substrate. The first ILD layer can include one or more layers of insulating materials such as oxides, nitrides, oxynitrides, low-k, or other materials. The first ILD layer 72 is patterned to define a contact opening 74. A contact plug structure is then formed within the opening and includes adhesion/barrier film 76 and conductive fill material 78. In one particular embodiment, the adhesion barrier layer is a titanium/titanium nitride film and the conductive fill material is tungsten. Other materials could be used for the conductive plug structure.

Figure 8:
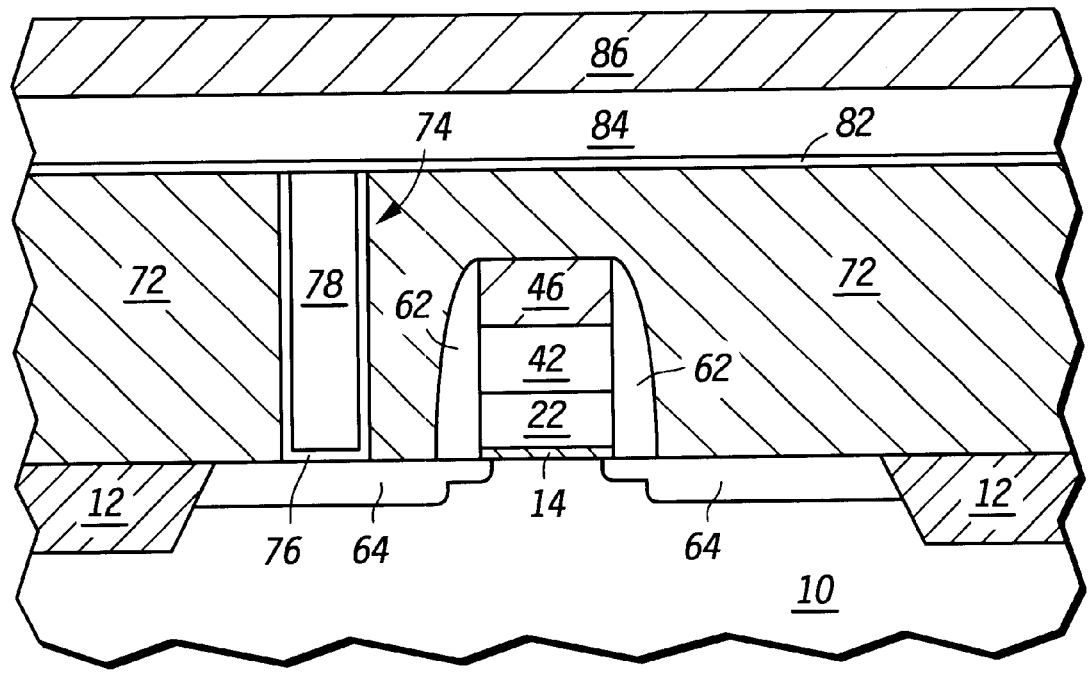
FIG. 8 includes an illustration of a cross-sectional view of the substrate of FIG. 7 after forming a substantially completed device.

Processing is continued to form a substantially completed device as illustrated in FIG. 8. FIG. 8 includes an adhesion/barrier film 82 and a conductive fill material 84. In one particular embodiment, the adhesion barrier film 82 includes tantalum, tantalum nitride, or other refractory metal or refractory metal nitrides. The conductive fill material 84 can include mostly aluminum, tungsten, or copper. Small amounts of dopants may be added to the conductive film material 84 to increase its resistance to electromigration or other adverse effects. A passivation layer 86 is then formed over the uppermost level of interconnects to complete formation of the device. The passivation layer 86 may include one or more layers of a insulating materials such as oxide nitride, oxynitride or the like.

The embodiment as illustrated in FIGS. 1–8 included a gate structure that was formed by depositing and then etching a plurality of layers. Alternatively, the gate electrode can include an inlaid gate structure.

Although not discussed, the layers 22 and 42 may or may not be annealed. Further, the anneal may be performed after forming the amorphous conductive layer 22, the crystalline conductive layer 42, after the anti-reflective layer 46, or at some other subsequent processing step. Should stress within the film be an issue, the anneal may need to be performed before the stress gets too high.

In still another embodiment, a different layer may be formed directly onto the gate dielectric layer. For example, in one embodiment, a titanium nitride or a silicon layer may be formed over the gate dielectric and in direct contact with the gate dielectric before the amorphous conductive layer 22 is formed. Because the amorphous conductive layer 22 is formed before the crystalline conductive material 42, any fluorine from the crystalline conductive layer 42 should not significantly interfere with or pass through the titanium nitride or silicon layer.

Embodiments of the present invention allow a gate stack to be formed that has a metal gate that is less susceptible to problems related to fluorine such as lowering the dielectric constant of the gate dielectric film, or having problems with adhesion or causing leakage current problems. The embodiments allow greater flexibility for overlying metals such that low resistivity gate electrodes can be formed that still have desirable characteristics without the adverse effects from fluorine. Even after annealing the films, fluorine from the crystalline metallic layer 42 does not completely diffuse through the amorphous conductive layer. Therefore, the structure formed not only has benefits of less fluorine at the time of deposition, but fluorine from an overlying film should not cause problems to an underlying gate dielectric or other sensitive film. Although embodiments shown only include one amorphous film and one crystalline film, the films could be stacked such that a composite of many different amorphous and crystalline films could have been formed. For example, a film could include amorphous crystalline amorphous or it could include amorphous/crystalline/amorphous/crystalline, etc. The etching and polishing characteristics of layers 22 and 42 should be the same as a conventional tungsten etch or polish. Therefore, there are not expected any changes in the etching or polishing characteristics of the device.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for forming a semiconductor device comprising:
   forming an insulating layer over a semiconductor substrate;
   forming an amorphous metal-containing layer over the insulating layer, wherein the amorphous metal-containing layer is further characterized as a tungsten-containing layer that is formed using:
      a tungsten-containing gas that includes tungsten hexafluoride; and
      a semiconductor-containing gas that includes silane, wherein a gas flow ratio of silane to tungsten hexafluoride is less than approximately 3:1; and
   forming a crystalline metal-containing layer over the amorphous metal-containing layer.

2. The process of claim 1, wherein the insulating layer includes a gate dielectric layer.

3. The process of claim 2, wherein the gate dielectric layer includes a compound containing an element selected from a group consisting of silicon, nitrogen, tantalum, titanium, strontium, hafnium, zirconium, and aluminum.

4. The process of claim 1, wherein a thickness of the tungsten-containing layer is in a range of approximately 2–20 nanometers.

5. The process of claim 1, wherein the crystalline metal-containing layer includes a tungsten-containing layer.

6. The process of claim 1, wherein a thickness of the crystalline tungsten-containing layer is in a range of approximately 20–50 nanometers.

7. The process of claim 1, further comprising forming a refractory metal nitride layer after forming the insulating layer and before forming the amorphous tungsten-containing layer.

8. The process of claim 1, further comprising:
   forming a gate electrode from the amorphous metal-containing layer and the crystalline metal-containing layer;
   forming an interconnect over the gate electrode; and
   forming a passivation layer over the interconnect.

9. A process for forming a conductive structure comprising:
   flowing a metal-containing gas; and
   flowing a scavenging gas, wherein:
      the scavenging gas includes a gas precursor selected from a group consisting of a semiconductive element, nitrogen, and oxygen;
      the metal-containing gas and the scavenging gas flow simultaneous during at least one point in time; and
      a metallic layer is formed and includes less than approximately ten percent of any element within the scavenging gas.

10. The process of claim 9, wherein the metal-containing gas includes a refractory metal element.

11. The process of claim 9, wherein the metal-containing gas includes halogen atoms and the scavenging gas includes a semiconductive element.

12. The process of claim 9, wherein the metal-containing gas includes carbon atoms and the scavenging gas includes oxygen atoms.

13. The process of claim 9, wherein the metallic layer is amorphous as formed.

14. The process of claim 9, wherein the conductive structure includes a gate electrode.

15. A process for forming a semiconductor device comprising:
   forming an insulating layer over a semiconductor substrate;
   forming an amorphous metal-containing layer over the insulating layer, wherein the amorphous metal-containing layer is further characterized as a tungsten-containing layer that is formed using:
      a tungsten-containing gas that includes tungsten hexafluoride; and
      a semiconductor-containing gas, wherein the semiconductor containing gas consists of a gas selected from a group consisting of chlorosilane, dichlorosilane, and germane; and
   forming a crystalline metal-containing layer over the amorphous metal-containing layer.

\* \* \* \* \*